United States Patent
Kim

(10) Patent No.: US 7,965,533 B2
(45) Date of Patent: Jun. 21, 2011

(54) SEMICONDUCTOR DEVICE INCLUDING PLURALITY OF PARALLEL INPUT/OUTPUT LINES AND METHODS OF FABRICATING AND USING THE SAME

(75) Inventor: Sung-hoon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 387 days.

(21) Appl. No.: 12/292,825

(22) Filed: Nov. 26, 2008

(65) Prior Publication Data

US 2009/0207654 A1 Aug. 20, 2009

(30) Foreign Application Priority Data

Feb. 18, 2008 (KR) .................. 10-2008-0014422

(51) Int. Cl.
*G11C 5/06* (2006.01)
(52) U.S. Cl. .......................... 365/63; 365/174
(58) Field of Classification Search .............. 365/63, 365/174
See application file for complete search history.

(56) References Cited

U.S. PATENT DOCUMENTS

| | | | |
|---|---|---|---|
| 5,410,670 A * | 4/1995 | Hansen et al. | 711/169 |
| 5,602,793 A * | 2/1997 | Tomishima et al. | 365/226 |
| 7,499,340 B2 * | 3/2009 | Kajigaya et al. | 365/189.02 |
| 2002/0097628 A1* | 7/2002 | Fujisawa et al. | 365/226 |
| 2005/0036349 A1 | 2/2005 | Jakobs et al. | |
| 2007/0002601 A1 | 1/2007 | Hasunuma et al. | |

FOREIGN PATENT DOCUMENTS

| | | |
|---|---|---|
| KR | 10-2000-0058001 | 9/2000 |
| KR | 10-2006-0045988 | 5/2006 |

* cited by examiner

*Primary Examiner* — Tuan T. Nguyen
(74) *Attorney, Agent, or Firm* — Harness, Dickey & Pierce, P.L.C.

(57) ABSTRACT

Provided are semiconductor devices and methods for fabricating and using the semiconductor devices, wherein the semiconductor devices may include a first element, a second element, and a plurality of parallel IO lines connecting the first element with the second element. The plurality of IO lines may have different lengths and the shortest IO line from among the plurality of the IO lines may be adjacent to a longest IO line from among the plurality of the IO lines.

20 Claims, 9 Drawing Sheets

SEMICONDUCTOR DEVICE INCLUDING PLURALITY OF PARALLEL INPUT/OUTPUT LINES AND METHODS OF FABRICATING AND USING THE SAME

PRIORITY STATEMENT

This application claims priority under 35 U.S.C. §119 to Korean Patent Application No. 10-2008-0014422, filed on Feb. 18, 2008, in the Korean Intellectual Property Office (KIPO), the entire contents of which are herein incorporated by reference.

BACKGROUND

1. Field

Example embodiments relate to a semiconductor device, and more particularly, to a semiconductor device having relatively large spaces and pitches between a plurality of input/output (IO) lines. Example embodiments also relate to methods of fabricating and using the same.

2. Description of the Related Art

An external device may read data of a memory core by performing various processes. The data may be transmitted through an input/output line. For example, write data may be transmitted from a peripheral circuit to the memory core through various input/output lines and read data may be transmitted from the memory core to a peripheral circuit through various input/output lines.

SUMMARY

Example embodiments provide a semiconductor device having relatively large spaces and pitches between a plurality of input/output (IO) lines. Example embodiments also provide for methods of fabricating and using the semiconductor device.

According to example embodiments, a semiconductor device may include a first element, a second element, and a plurality of parallel IO lines connecting the first element with the second element. The plurality of IO lines may have different lengths and the shortest IO line from among the plurality of the IO lines may be adjacent to a longest IO line from among the plurality of the IO lines.

According to example embodiments, a method of fabricating a semiconductor device may include providing a first element, providing a second element, connecting the first element to the second element with a plurality of parallel IO lines. The plurality of parallel IO lines may be provided with different lengths and a shortest IO line, from among the plurality of the IO lines, may be adjacent to a longest IO line from among the plurality of the IO lines.

According to example embodiments, a method of using a semiconductor device may include transmitting data from a first element to a second element through plurality of parallel IO lines wherein the shortest IO line from among the plurality of the IO lines may be adjacent to a longest IO line from among the plurality of the IO lines.

BRIEF DESCRIPTION OF THE DRAWINGS

Example embodiments will be more clearly understood from the following detailed description taken in conjunction with the accompanying drawings.

FIG. 1 is a diagram of a semiconductor device according to example embodiments;

FIG. 2 is a perspective view of a plurality of input/output (IO) lines illustrated in FIG. 1, according to example embodiments;

FIG. 3 is a plan view of the IO lines illustrated in FIG. 1, according to example embodiments;

FIG. 4 is a diagram of a semiconductor device according to example embodiments;

FIG. 5 is a plan view of a plurality of IO lines illustrated in FIG. 4;

FIG. 6 is a diagram of a semiconductor device according to example embodiments;

FIG. 7 is a diagram of a semiconductor device according to example embodiments;

FIG. 8 is a diagram of a control unit and a plurality of memory chips of a semiconductor device, according to example embodiments; and FIG. 9 is a diagram of a control unit and a plurality of pads of a semiconductor device, according to example embodiments.

DETAILED DESCRIPTION OF EXAMPLE EMBODIMENTS

Figure 1:
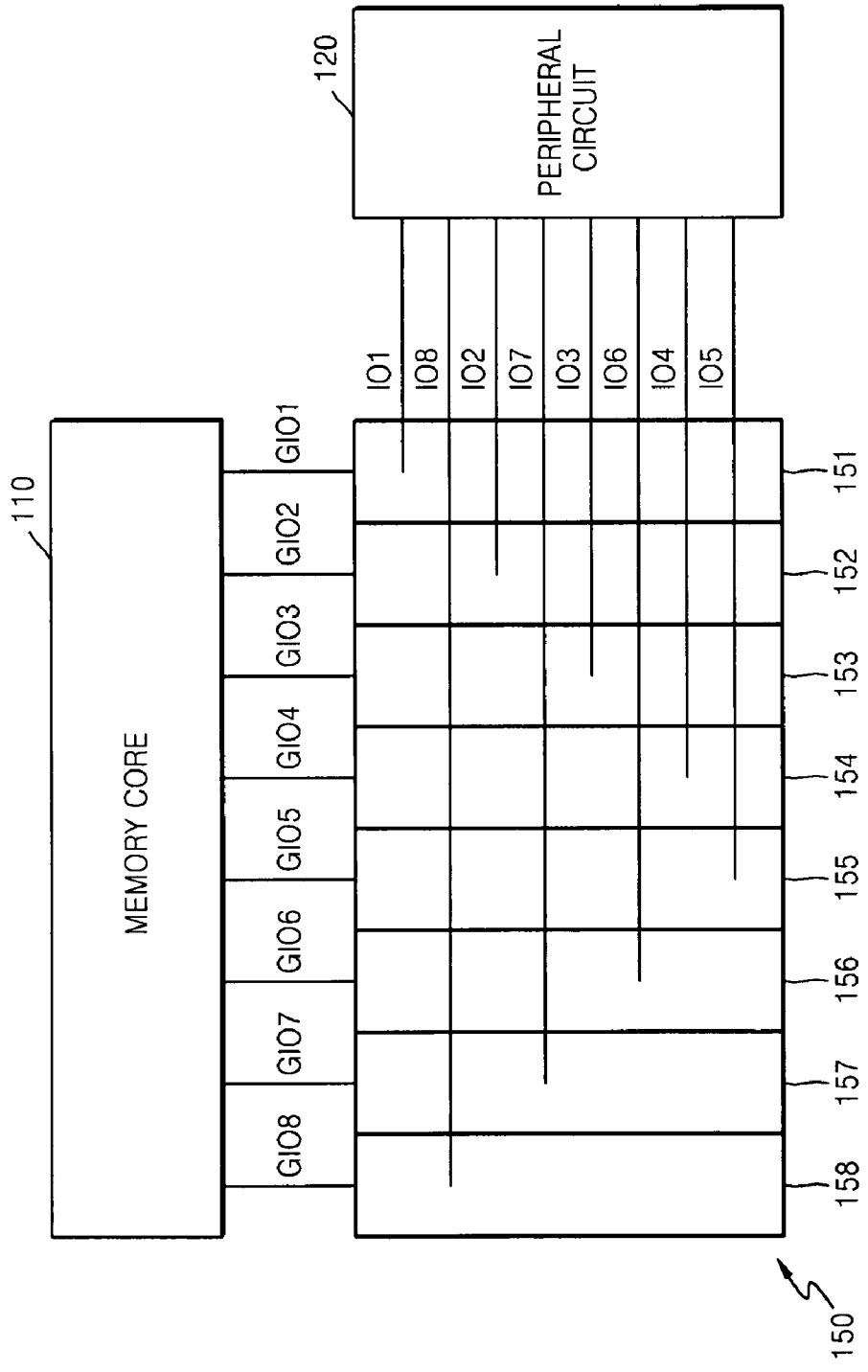
FIGS. 1-9 represent non-limiting, example embodiments as described herein.

Example embodiments will now be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of example embodiments to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any an all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures which exemplify specific shapes or regions of elements, and do not limit example embodiments.

FIG. 1 is a diagram of a semiconductor device according to example embodiments. Referring to FIG. 1, the semiconductor device according to example embodiments may include a memory core 110, a peripheral circuit 120, an input/output (IO) control unit 150, and a plurality of IO lines IO1 through IO8.

The memory core 110 may include a plurality of memory cells. Read data may be read from the memory core 110 and may be amplified by a bit line sense amplifier (not shown) and may be transmitted through local IO lines. The read data may be transmitted to the IO control unit 150 through global IO lines GIO1 through GIO8. The IO control unit 150 may amplify the read data and may transmit the read data to the peripheral circuit 120 through the IO lines IO1 through IO8. Write data may be written in the memory core 110 and may be transmitted from the peripheral circuit 120 to the IO control unit 150 through the IO lines IO1 through IO8. The IO control unit 150 may transmit the write data to the memory core 110 through the global IO lines GIO1 through GIO8.

The IO control unit 150 may include a plurality of IO units 151 through 158. The IO units 151 through 158 may be IO sense amplifiers or write drivers. The IO units 151 through 158 may transmit and may receive data to and from the peripheral circuit 120 through the IO lines IO1 through IO8.

As illustrated in FIG. 1, the IO units 151 through 158 may be separated from the peripheral circuit 120 by different distances. Thus, lengths of the IO lines IO1 through IO8, which may connect the IO units 151 through 158 to the peripheral circuit 120, may be different from each other. The IO lines IO1 through IO8 may be arranged parallel to each other and may or may not lie in the same plane. In the semiconductor device illustrated in FIG. 1, from among the IO lines IO1 through IO8, a shortest IO line IO1 may be arranged adjacent to a longest IO line IO8.

Figure 2:
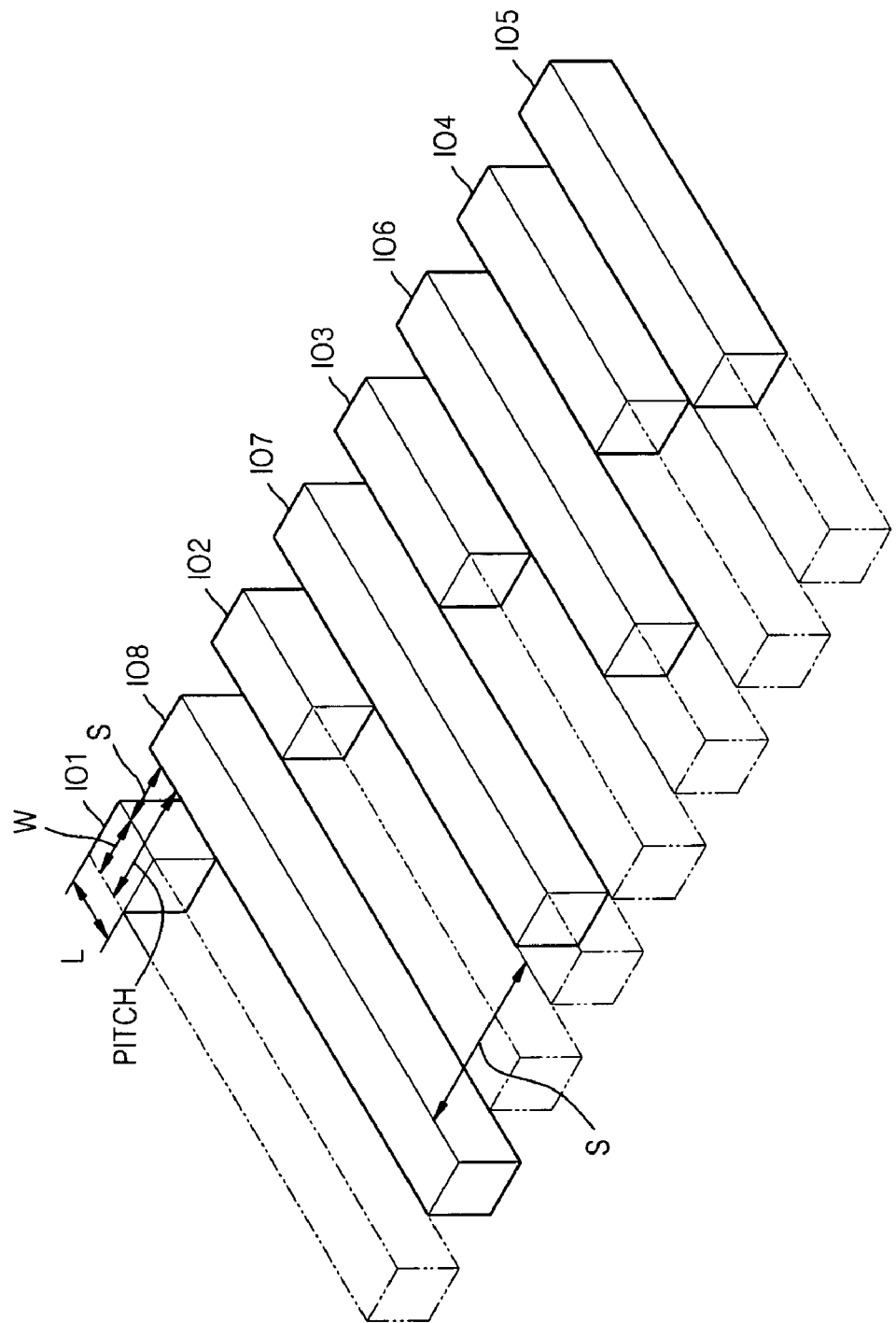
Figure 3:
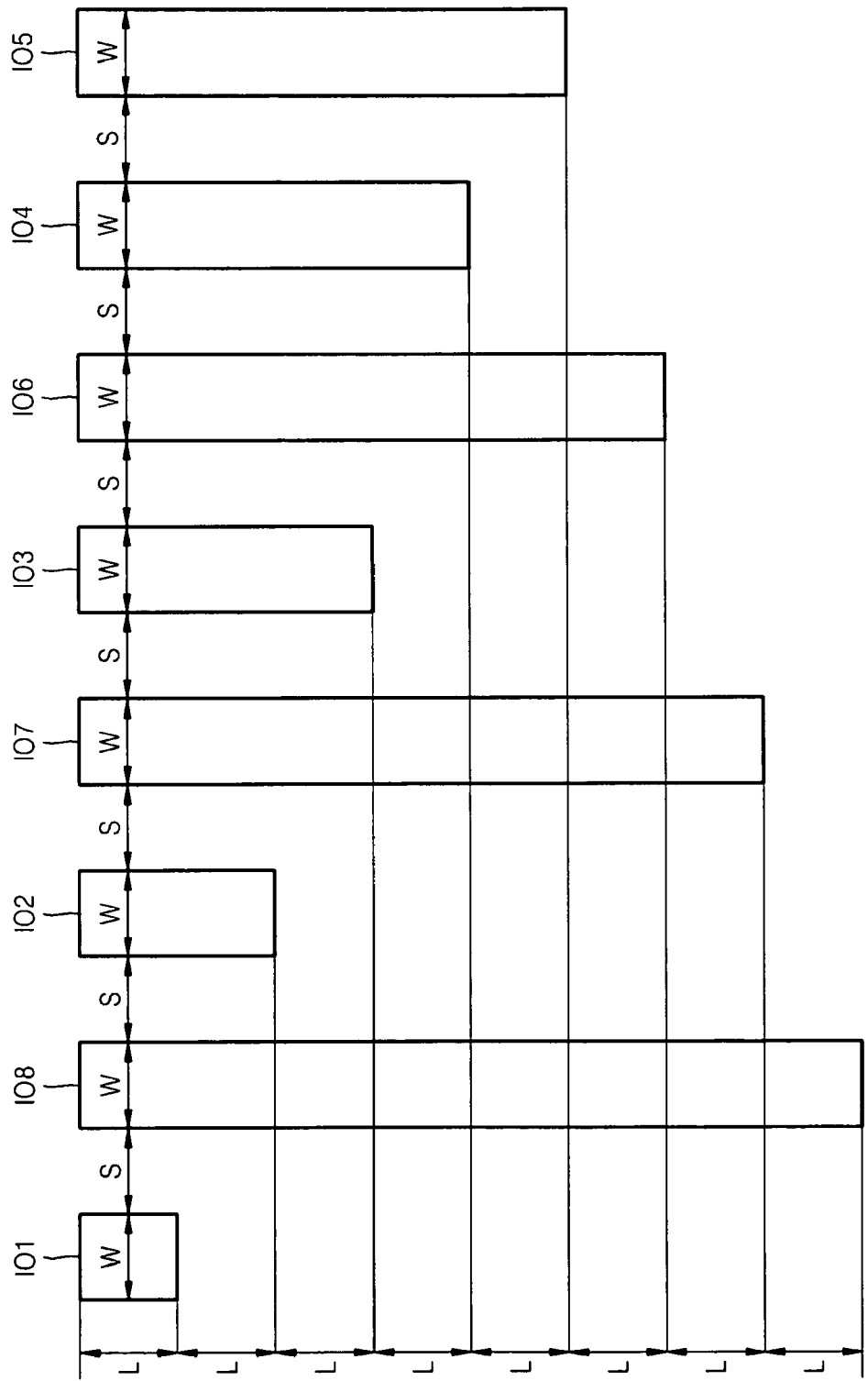

FIG. 2 is a perspective view of the IO lines IO1 through IO8 illustrated in FIG. 1, according to example embodiments. FIG. 3 is a plan view of the IO lines IO1 through IO8 illustrated in FIG. 1, according to example embodiments. FIGS. 2 and 3 illustrate a semiconductor device according to example embodiments, wherein the shortest IO line IO1 may be arranged adjacent to the left side of a longest IO line IO8. The length L of the shortest IO line IO1 may be about one eight the length of the longest IO line IO8 so that seven eighths of the left side of the longest IO line IO8 is not adjacent to an IO line. In example embodiments, a pitch, which is defined as a sum of the space S between IO lines and a width W of an IO line, may be maximized or increased.

In FIG. 2, if it is assumed that the shortest IO line IO1 is extended to a region indicated by a dotted line, the space between the shortest IO line IO1 and the longest IO line IO8 may be constant in every region of the shortest IO line IO1. However, in the semiconductor device according to example embodiments, the shortest IO line IO1 may exist only in a region indicated by a solid line, and thus, in a region where the shortest IO line IO1 does not exist, the space to the left of the longest IO line IO8 may be increased by the width of the shortest IO line IO1. Accordingly, the semiconductor device may have relatively large space to the left of the longest IO line IO8.

Figure 4:
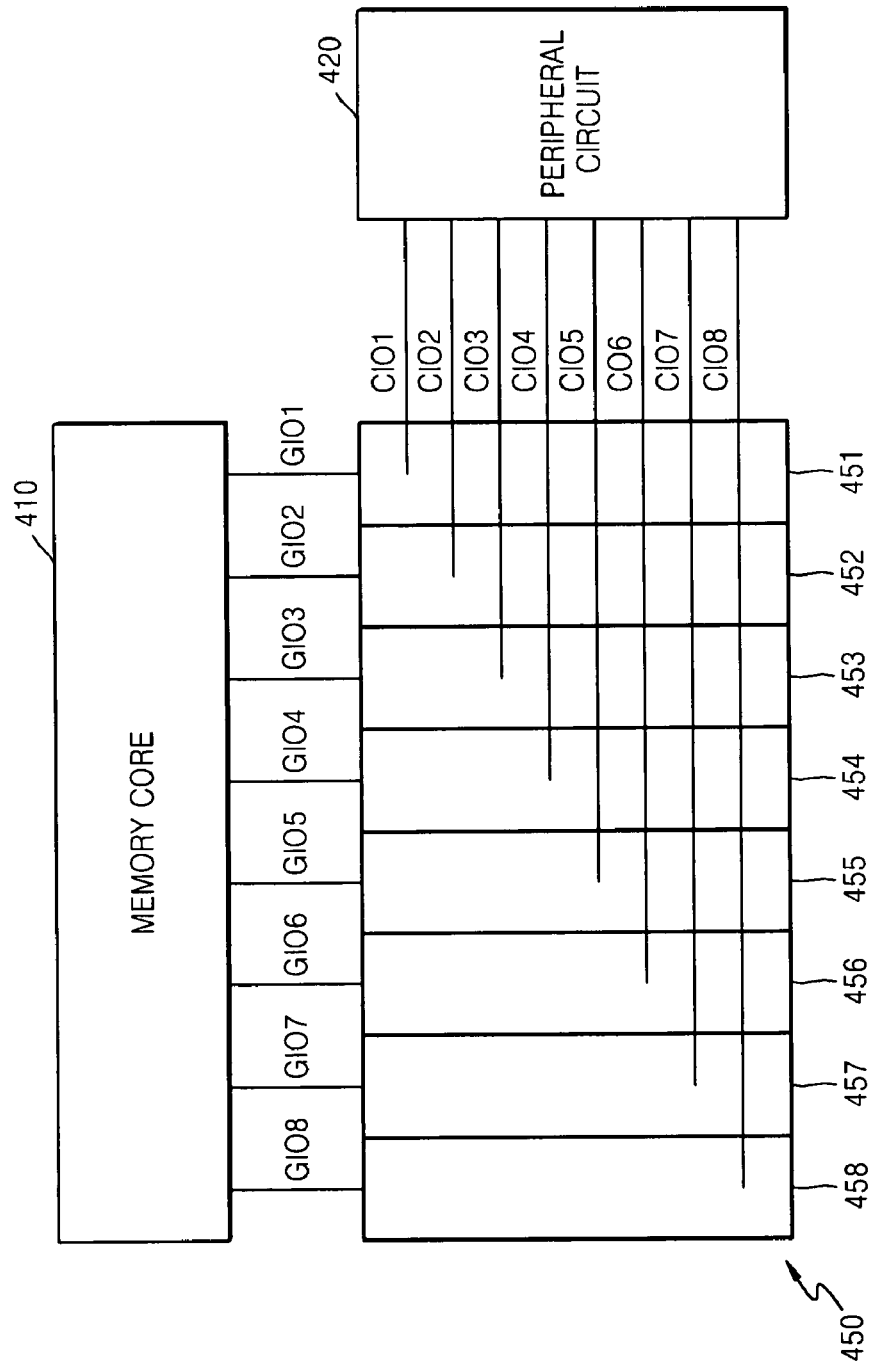
Figure 5:
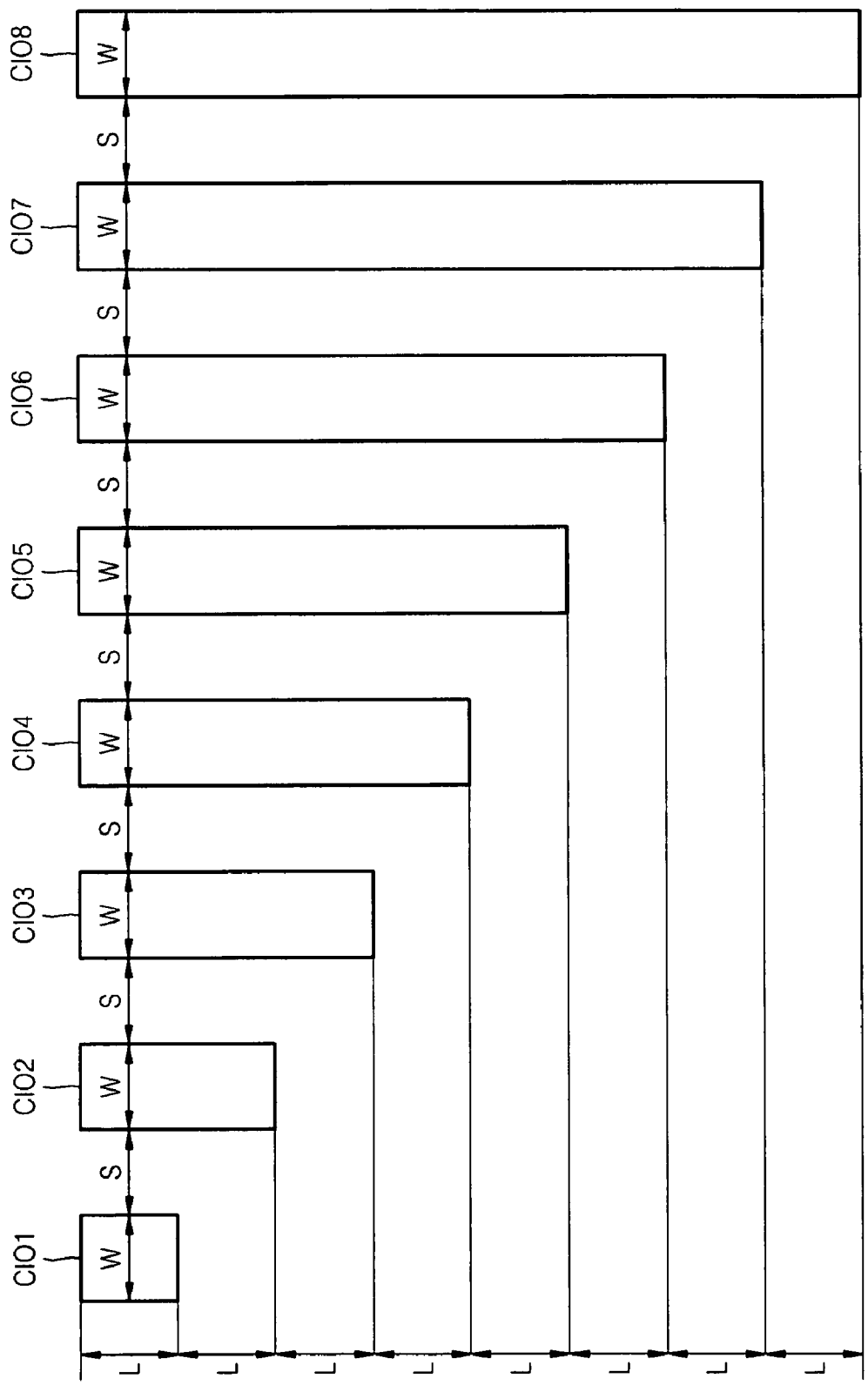

FIG. 4 is a diagram of a semiconductor device according to example embodiments. FIG. 5 is a plan view of a plurality of IO lines CIO1 through CIO8 illustrated in FIG. 4. Referring to FIGS. 4 and 5, a second longest IO line CIO7 may be arranged adjacent to a longest IO line CIO8. The second longest IO line CIO7 may be arranged adjacent to a seven eighths region of the longest IO line CIO8 and no IO line may be arranged adjacent to a remaining one eighth region of the longest IO line CIO8.

A semiconductor device according to example embodiments illustrated in FIG. 3 and the semiconductor device according to example embodiments illustrated in FIG. 5 will be compared to each other. In the semiconductor device illustrated in FIG. 3, a space to the left (hereinafter referred to as a "left space") of a one eighth region of the longest IO line IO8 may be 1S, and the left space of a remaining seven eighths region of the longest IO line IO8 may be larger than 1W+1S. Thus, an average value of the left space of the longest IO line IO8 may be larger than $1S+\frac{7}{8}*W$. (Refer to Equation 1.)

$$\tfrac{1}{8}*1S+\tfrac{7}{8}*(1W+1S)=1*S+\tfrac{7}{8}*W \tag{1}$$

For the semiconductor device illustrated in FIG. 5, a left space of a seven eighths region of the longest CIO line IO8 may be 1S, and the left space of a remaining one eighth region of the longest IO line CIO8 may be larger than 1W+1S. Thus, an average value of the left space of the longest IO line CIO8 may be larger than $1S+\frac{1}{8}*W$. (Refer to Equation 2.)

$$\tfrac{7}{8}*1S+\tfrac{1}{8}*(1W+1S)=1*S+\tfrac{1}{8}*W \tag{2}$$

As a result, the left space of the longest IO line IO8 may be $\frac{6}{8}*W$ larger than the left space of the longest IO line CIO8. As such, the semiconductor device according to example embodiments may have a relatively large space between the shortest IO line IO1 and the longest IO line IO8, by arranging the shortest IO line IO1 adjacent to the longest IO line IO8.

Referring to FIGS. 1 through 3, in the semiconductor device according to example embodiments, the longest IO line IO8 may be arranged between the shortest IO line IO1 and a second shortest IO line IO2. The second shortest IO line IO2 may be arranged adjacent to a two eighths region of a right side of the longest IO line IO8 and no IO line may be arranged adjacent to a remaining six eighths region of the right side of the longest IO line IO8.

Referring to FIG. 3, in the semiconductor device according to example embodiments, a space to the right (hereinafter referred to as a "right space") of a two eighths region of the longest IO line IO8 may be 1S, and the right space of a remaining six eighths region of the longest IO line IO8 may be larger than 1W+1S. Thus, an average value of the right space of the longest IO line IO8 may be larger than $1S+\frac{6}{8}*W$. (Refer to Equation 3.)

$$\tfrac{2}{8}*1S+\tfrac{6}{8}*(1W+1S)=1*S+\tfrac{6}{8}*W \tag{3}$$

For the semiconductor device illustrated in FIG. 5, the average value of the left space of the longest IO line CIO8 may be larger than $1S+\frac{1}{8}*W$. (Refer to Equation 2.) As a result, the right space of the longest IO line IO8 of the semiconductor device according to example embodiments illustrated in FIG. 3 may be $\frac{5}{8}*W$ larger than the left space of the longest IO line CIO8 of the semiconductor device according to example embodiments illustrated in FIG. 5.

Referring back to FIGS. 1 through 3, in the semiconductor device according to example embodiments, the second shortest IO line IO2 may be arranged between a second longest IO line IO7 and the longest IO line IO8. In example embodiments, left and right spaces of the second longest IO line IO7 of the semiconductor device illustrated in FIG. 3 may be larger than the left and right spaces of the second longest IO line CIO7 of the semiconductor device illustrated in FIG. 5. Also, in FIGS. 1 through 3, an arrangement order of other IO lines IO3, IO6, IO4, and IO5 is illustrated. The semiconductor device according to example embodiments may have relatively large spaces between the IO lines IO1 through IO8 by arranging the IO lines IO1 through IO8 in an order of IO1, IO8, IO2, IO7, IO3, IO6, IO4, and IO5.

Figure 6:
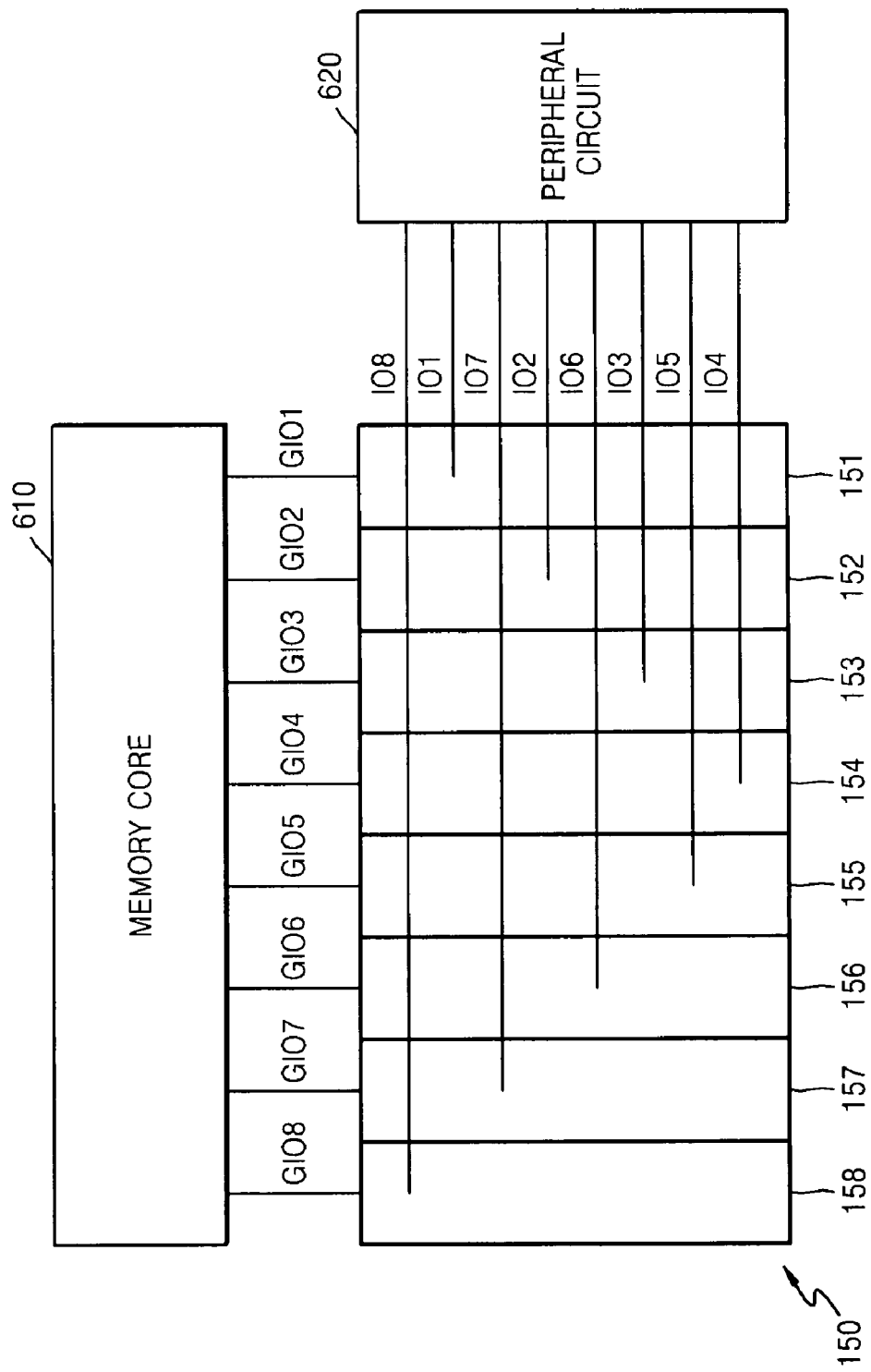

FIG. 6 is a diagram of a semiconductor device which may include a memory core 610, a peripheral circuit 620, and an IO control unit 150 according to example embodiments. Referring to FIG. 6, a longest IO line IO8 may be arranged at an outermost position of a plurality of IO lines IO1 through IO8. A shortest IO line IO1 may be arranged between the longest IO line IO8 and a second longest IO line IO7. Therefore, the IO lines IO1 through IO8 may be arranged in an order of IO8, IO1, IO7, IO2, IO6, IO3, IO5, and IO4. In example embodiments, the semiconductor device may also have relatively large spaces between the IO lines IO1 through IO8.

Figure 7:
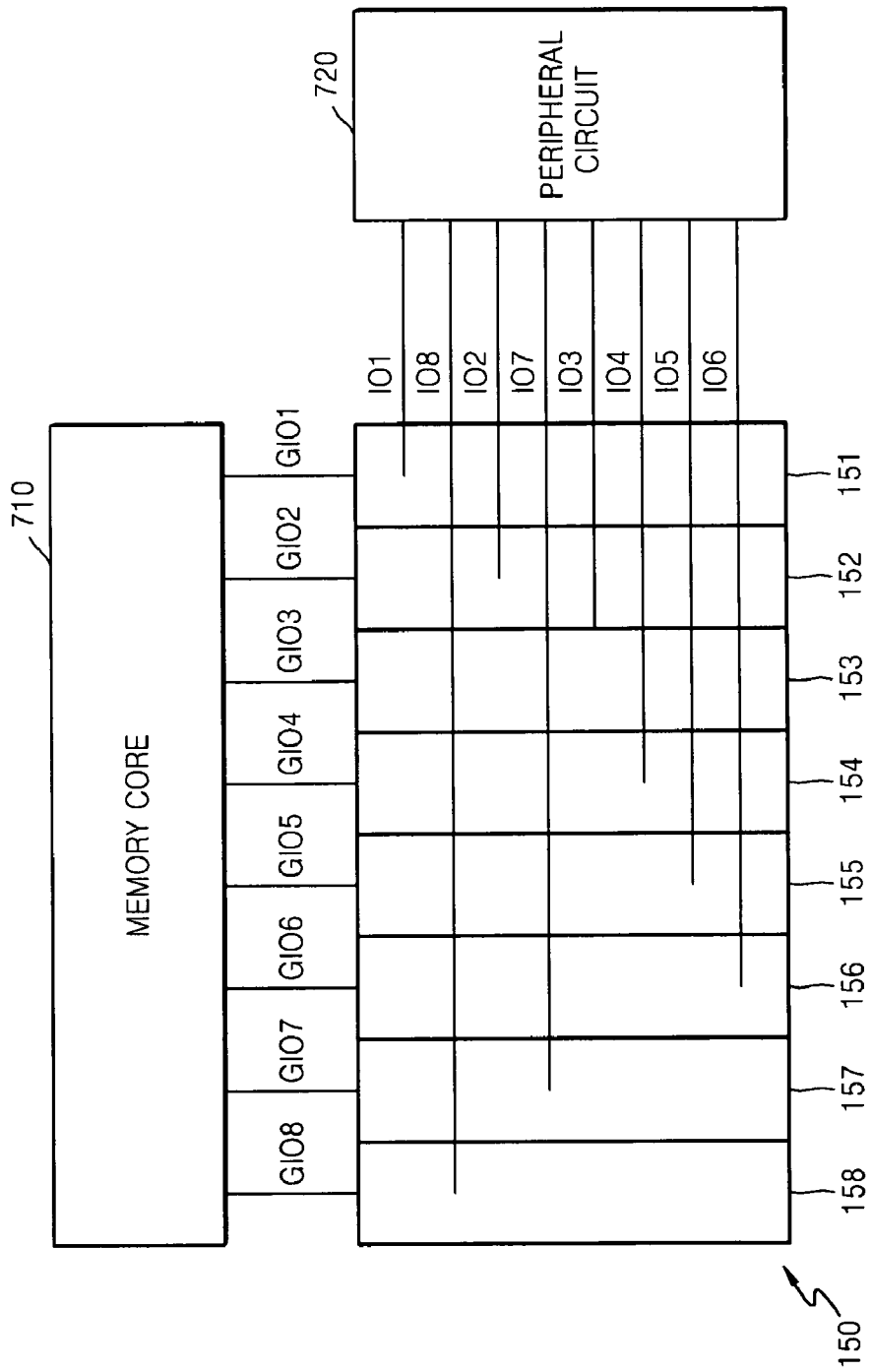

FIG. 7 is a diagram of a semiconductor device which may include a memory core 710, a peripheral circuit 720, and an IO control unit 150 according to example embodiments. Referring to FIG. 7, the semiconductor device according to example embodiments, may further include a plurality of IO lines IO1 through IO8 arranged in an order of IO1, IO8, IO2, IO7, IO3, IO4, IO5, IO6. An arrangement order of IO lines IO1, IO8, IO2, and IO7 may be the same as the arrangement order of the IO lines IO1, IO8, IO2, and IO7 illustrated in FIGS. 1 through 3. IO lines IO3 through IO6, in FIG. 7, may be arranged in an order of IO3, IO4, IO5, and IO6 whereas IO lines IO3 through IO6, in FIG. 1, may be arranged in an order of IO3, IO6, IO4, and IO5.

The IO lines IO1 through IO8 may be arranged in an order of IO1, IO8, IO2, IO3, IO4, IO5, IO6, and IO7, an order of IO1, IO7, IO2, IO8, IO3, IO6, IO4, and IO5, an order of IO8, IO1, IO7, IO2, IO6, IO5, IO4, and IO3, an order of IO8, IO1, IO2, IO3, IO4, IO5, IO6, and IO7, or an order of IO7, IO1, IO2, IO3, IO4, IO5, IO6, and IO8. One of ordinary skill in the art may variously change the arrangement order by referring to example embodiments, in order to have relatively large spaces between the IO lines IO1 through IO8.

Also, in the semiconductor device according to example embodiments, the number of IO lines may not be limited to eight. For example, the number of IO lines may be sixteen. In example embodiments, the IO lines may be arranged in an order of a shortest IO line, a longest IO line, a second shortest IO line, a second longest IO line and so on, or an order of the longest IO line, the shortest IO line, the second longest IO line, the second shortest IO line and so on.

In example embodiments, the number of IO lines may be n and first through nth IO lines may be named in ascending order of length, first, second, (n−1)th and nth IO lines may be arranged in an order of the first IO line, the nth IO line, the second IO line, and the (n−1)th IO line. Alternatively, the first, second, (n−1)th and nth IO lines may be arranged in an order of the nth IO line, the first IO line, the (n−1)th IO line, and the second IO line. Third through (n−2)th IO lines may be arranged in various orders. If encoded data is transmitted through the IO lines, n may be two (2) to the exponent k ($2^k$).

Figure 8:
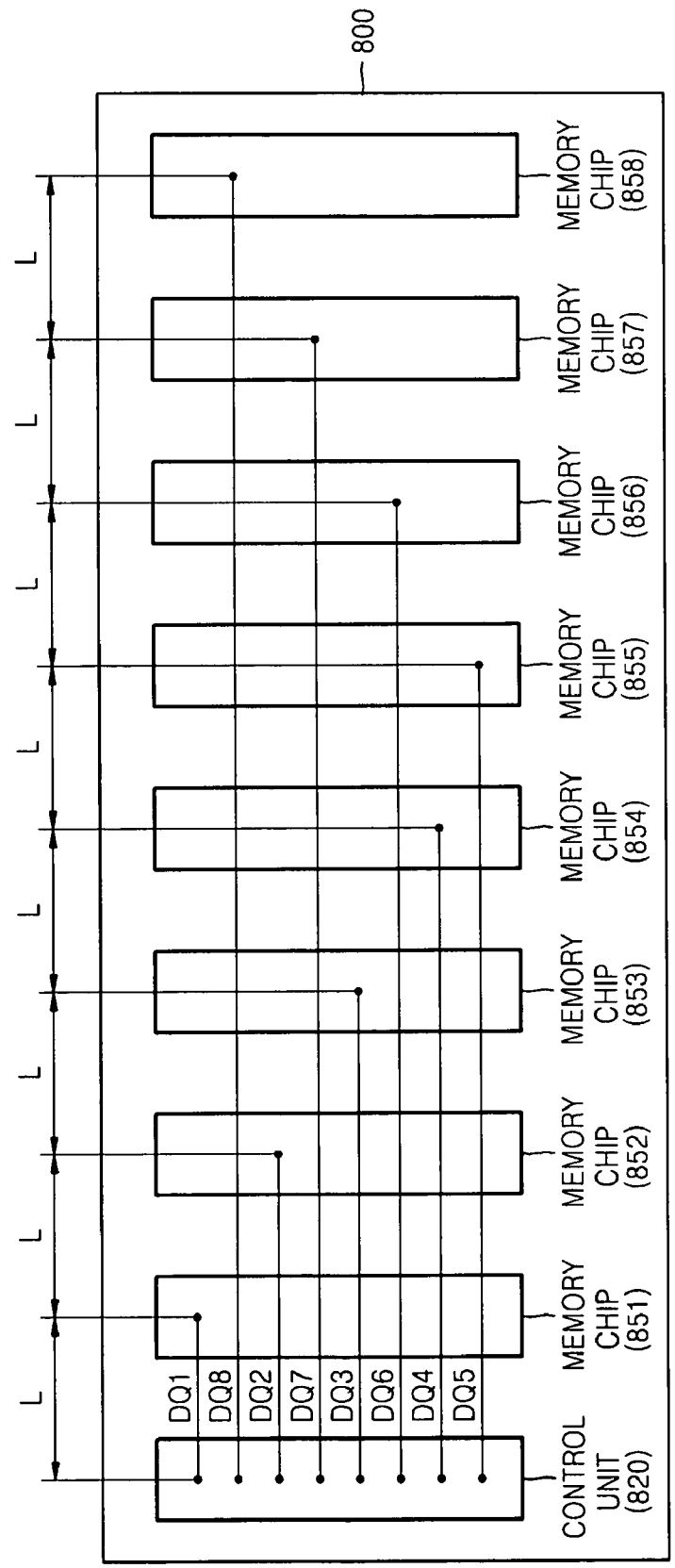

FIG. 8 is a diagram of a control unit 820 and a plurality of memory chips 851 through 858 of a semiconductor device, according to example embodiments. Referring to FIG. 8, the semiconductor device 800 according to example embodiments may include the memory chips 851 through 858. In example embodiments, the memory chips 851 through 858 may be separated different distances from the control unit 820. Thus, lengths of a plurality of data lines DQ1 through DQ8, which connect the memory chips 851 through 858 to the control unit 820, may be different from each other. The data lines DQ1 through DQ8 may be arranged parallel to each other and may or may not lie in the same plane.

In the semiconductor device illustrated in FIG. 8, from among the data lines DQ1 through DQ8, a shortest data line DQ1 may have a length L, which is about one eighth the length of the longest data line DQ8, and may be arranged adjacent to a longest data line DQ8. Arrangement orders of the IO lines IO1 through IO8 illustrated in FIGS. 1, 2, 3, 6, and 7 may be applied to the data lines DQ1 through DQ8. Various changes of the arrangement orders described above may also be applied to the data lines DQ1 through DQ8. Also, the number of data lines included in the semiconductor device according to example embodiments may not be limited to eight.

Figure 9:
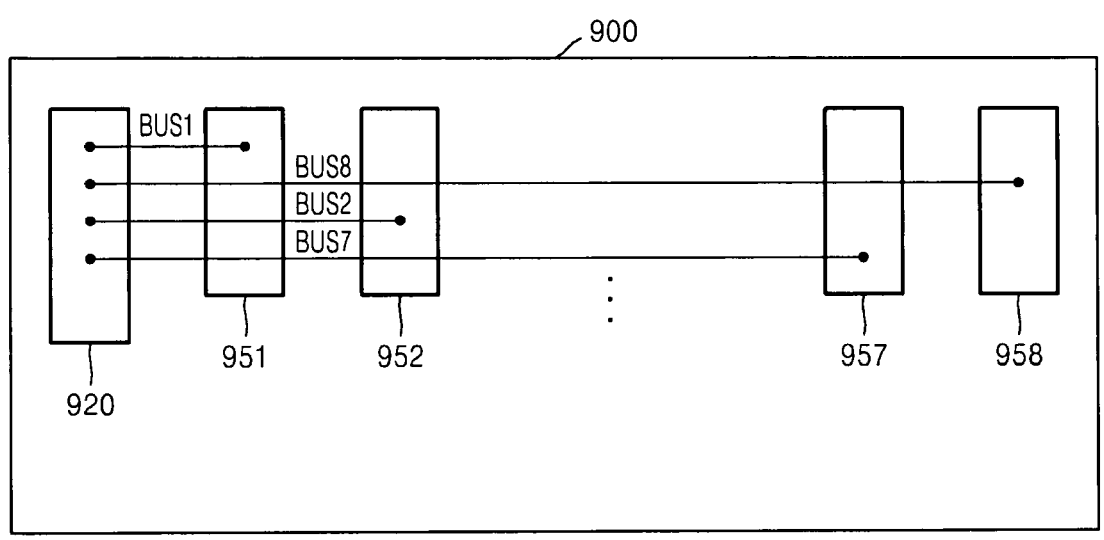

FIG. 9 is a diagram of a control unit 920 and a plurality of pads 951 through 958 of a semiconductor device 900, according to example embodiments. Referring to FIG. 9, the semiconductor device 900 according to example embodiments may include the pads 951 through 958. In example embodiments, the pads 951 through 958 may be separated different distances from the control unit 920. Thus, lengths of a plurality of bus lines BUS1 through BUS8, which connect the pads 951 through 958 to the control unit 920, may be different from each other. The bus lines BUS1 through BUS8 may be arranged parallel to each other and may or may not lie in the same plane.

In the semiconductor device 900 illustrated in FIG. 9, from among the bus lines BUS1 through BUS8, a shortest bus line BUS1 may be arranged adjacent to a longest bus line BUS8. Arrangement orders of the IO lines IO1 through IO8 illustrated in FIGS. 1, 2, 3, 6, and 7 may be applied to the bus lines BUS1 through BUS8. Various changes of the arrangement orders, which are described above, may also be applied to the bus lines BUS1 through BUS8. The number of bus lines included in the semiconductor device according to example embodiments may not be limited to eight.

Furthermore, the arrangement orders of the IO lines IO1 through IO8 illustrated in FIGS. 1, 2, 3, 6, and 7 may also be applied to conventional transmission lines. For example, a plurality of transmission lines having different lengths from each other may be arranged parallel to each other in accordance with the arrangement orders of the IO lines IO1 through IO8 illustrated in FIGS. 1, 2, 3, 6, and 7. As described above, according to example embodiments, a semiconductor device may have relatively large spaces and pitches between a plurality of IO lines.

While example embodiments have been particularly shown and described with reference to example embodiments thereof, it will be understood by those of ordinary skill in the art that various changes in form and details may be made therein without departing from the spirit and scope of the following claims.

What is claimed is:
1. A semiconductor device comprising:
a first element;
a second element; and
a plurality of parallel IO lines connecting the first element with the second element, the plurality of IO lines having different lengths, wherein a shortest IO line from among the plurality of the IO lines is adjacent to a longest IO line from among the plurality of the IO lines.

2. The semiconductor device of claim 1, wherein the longest IO line is between the shortest IO line and a second shortest IO line.

3. The semiconductor device of claim 2, wherein the second shortest IO line is between the longest IO line and a second longest IO line.

4. The semiconductor device of claim 1, wherein the longest IO line is at an outermost position of the plurality of the IO lines.

5. The semiconductor device of claim 4, wherein the shortest IO line is between the longest IO line and a second longest IO line.

6. The semiconductor device of claim 1, wherein the semiconductor device further includes a memory core, and the first element is a peripheral circuit and the second element is an IO control unit to transmit read data from the memory core to the peripheral circuit or transmit write data from the peripheral circuit to the memory core via the plurality of parallel IO lines.

7. The semiconductor device of claim 6, wherein the IO control unit comprises a plurality of IO sense amplifiers or a plurality of IO drivers and the plurality of the IO lines are connected to the plurality of the IO sense amplifiers or the plurality of the IO drivers.

8. The semiconductor device of claim 1, wherein the plurality of parallel IO lines are first through nth (where n is an even number) parallel IO lines and are numbered in ascending order of length,
wherein the first through nth IO lines are in an order of a first IO line, an nth IO line, an ith (where i is a natural number equal to or greater than two and equal to or less than (n/2)−1) IO line, an ((n−i)+1)th IO line, an (n/2)th IO line, and an ((n/2)+1)th IO line.

9. The semiconductor device of claim 8, wherein the first element is a peripheral circuit and the second element is a plurality of nth IO sense amplifiers separated different distances from a peripheral circuit of the semiconductor device, and the first through nth IO lines connect the first through nth IO sense amplifiers to the peripheral circuit.

10. The semiconductor device of claim 8, wherein the first element is a peripheral circuit and the second element is a plurality of nth IO drivers separated different distances from a peripheral circuit of the semiconductor device and the first through nth IO lines connect the first through nth IO drivers and to the peripheral circuit.

11. The semiconductor device of claim 8, wherein n is $2^k$ (k is a natural number).

12. The semiconductor device of claim 1, wherein the first element is a plurality of memory chips in a row and the second element is a memory control unit at an end of the plurality of the memory chips and the plurality of parallel IO lines connects the plurality of the memory chips to the memory control unit.

13. The semiconductor device of claim 1, wherein the first element is a plurality of pads in a row, and the second element is a pad control unit at an end of the plurality of the pads, and the plurality of parallel IO lines connect the plurality of the pads to the pad control unit.

14. The semiconductor device of claim 13, wherein the plurality of parallel IO lines are first through nth (where n is a natural number) bus lines numbered in ascending order of length,
wherein the first through nth bus lines are in an order of a first bus line, an nth bus line, a second bus line, and an (n−1)th bus line or an order of the nth bus line, the first bus line, the (n−1)th bus line, and the second bus line.

15. The semiconductor device of claim 14, wherein, if n is an even number, the first through nth bus lines are arranged in an order of the first bus line, the nth bus line, an ith (where i is a natural number equal to or greater than two and equal to or less than n/2−1) bus line, an ((n−i)+1)th bus line, an (n/2)th bus line, and an ((n/2)+1)th bus line, or an order of the nth bus line, the first bus line, the ((n−i)+1)th bus line, the ith bus line, the ((n/2)+1)th bus line, and the (n/2)th bus line, and
wherein, if n is an odd number, the first through nth bus lines are arranged in an order of the first bus line, the nth bus line, an ith (where i is a natural number equal to or greater than two and equal to or less than ((n−1)/2) bus line, an ((n−i)+1)th bus line, and an ((n+1)/2)th bus line, or an order of the nth bus line, the first bus line, the ((n−i)+1)th bus line, the ith bus line, and the ((n+1)/2)th bus line.

16. A method of fabricating a semiconductor device comprising:
providing a first element;
providing a second element;
connecting the first element to the second element with a plurality of parallel IO lines, the plurality of parallel IO lines provided with different lengths,
wherein a shortest IO line from among the plurality of the IO lines is adjacent to a longest IO line from among the plurality of the IO lines.

17. The method of claim 16, further including providing a memory core, wherein the first element is a peripheral circuit and the second element is an IO control unit to transmit read data from the memory core to the peripheral circuit or to transmit write data from the peripheral circuit to the memory core.

18. The method of claim 16, wherein the first element is a plurality of memory chips in a row and the second element is a memory control unit at an end of the plurality of the memory chips.

19. The method of claim 16, wherein the first element is a plurality of pads in a row and the second element is a pad control unit at an end of the plurality of the pads.

20. A method of using a semiconductor device comprising:
transmitting data from a first element to a second element through a plurality of parallel IO lines wherein a shortest IO line from among the plurality of the IO lines is adjacent to a longest IO line from among the plurality of the IO lines.

* * * * *